United States Patent
Eloy et al.

(10) Patent No.: US 11,237,203 B2
(45) Date of Patent: Feb. 1, 2022

(54) METHOD AND DEVICE FOR DETECTING AN INVERTED CONNECTION OF A CRANKSHAFT SENSOR

(71) Applicants: CONTINENTAL AUTOMOTIVE FRANCE, Toulouse (FR);
CONTINENTAL AUTOMOTIVE GMBH, Hannover (DE)

(72) Inventors: Stéphane Eloy, Tournefeuille (FR);
Fabien Joseph, Castanet Tolosan (FR)

(73) Assignees: CONTINENTAL AUTOMOTIVE FRANCE, Toulouse (FR);
CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 16/633,001

(22) PCT Filed: Jul. 17, 2018

(86) PCT No.: PCT/FR2018/051810
§ 371 (c)(1),
(2) Date: Jan. 22, 2020

(87) PCT Pub. No.: WO2019/020903
PCT Pub. Date: Jan. 31, 2019

(65) Prior Publication Data
US 2020/0209306 A1  Jul. 2, 2020

(30) Foreign Application Priority Data

Jul. 25, 2017 (FR) ........................... 1757065

(51) Int. Cl.
*G01R 31/28* (2006.01)
*G01R 31/67* (2020.01)
(Continued)

(52) U.S. Cl.
CPC ........ *G01R 31/2829* (2013.01); *G01P 13/045* (2013.01); *G01R 31/67* (2020.01); *G01B 7/003* (2013.01)

(58) Field of Classification Search
CPC ........ G05B 1/00; G05B 2219/00; G06K 1/00; G06N 3/00; G06F 1/00
See application file for complete search history.

(56) References Cited

U.S. PATENT DOCUMENTS 5,977,765 A * 11/1999 Gibson ............... F02D 41/0097
324/165
7,975,534 B2    7/2011 McDonald et al.
(Continued)

FOREIGN PATENT DOCUMENTS

CN    101644200 A    2/2010
CN    102900525 A    1/2013
(Continued)

OTHER PUBLICATIONS

International Search Report, PCT/FR2018/051810, dated Oct. 23, 2018.
(Continued)

*Primary Examiner* — Jermele M Hollington
*Assistant Examiner* — Temilade S Rhodes-Vivour
(74) *Attorney, Agent, or Firm* — Nixon & Vanderhye

(57) ABSTRACT

A method for diagnosing an inversion of a crankshaft sensor includes the following steps: acquiring a signal by way of the crankshaft sensor, at each detection of a tooth, determining a tooth time elapsed since the previous tooth detection, at each detection of a tooth, calculating a ratio Ri of the tooth times according to the formula $Ri=(Ti-1)^2/(Ti*Ti-2)$, where Ri is the ratio, Ti is the last tooth time, Ti−1 is the penultimate tooth time, and Ti−2 is the tooth time preceding the penultimate tooth time, comparing the ratio Ri with a
(Continued)

low threshold Sb, indicative of a turn marker, and a high threshold Sh, indicative of an absence of inversion, a ratio Ri between the two thresholds Sb, Sh being indicative of an inversion.

20 Claims, 2 Drawing Sheets

(51) Int. Cl.
  *G01P 13/04* (2006.01)
  *G01B 7/00* (2006.01)

(56) References Cited

U.S. PATENT DOCUMENTS

| | | | |
|---|---|---|---|
| 10,215,591 B2 | 2/2019 | Mirassou et al. | |
| 2006/0022682 A1* | 2/2006 | Nakamura | G01V 3/088 324/681 |
| 2007/0113682 A1 | 5/2007 | Ehrlich et al. | |
| 2009/0276145 A1* | 11/2009 | Schafer | F01L 1/34 701/105 |
| 2012/0010045 A1* | 1/2012 | Nedorezov | F02N 11/0803 477/79 |
| 2013/0030755 A1 | 1/2013 | Zouboff et al. | |
| 2014/0167423 A1* | 6/2014 | Pischinger | H02P 9/008 290/40 A |
| 2014/0232379 A1* | 8/2014 | Nazarian | G01D 5/145 324/207.21 |
| 2015/0338989 A1* | 11/2015 | Noto | G06F 3/0412 345/174 |
| 2018/0080395 A1 | 3/2018 | Gouzenne | |

FOREIGN PATENT DOCUMENTS

| | | |
|---|---|---|
| CN | 105157558 A | 12/2015 |
| WO | WO 2005/124287 | 12/2005 |
| WO | WO 2006/009298 | 1/2006 |
| WO | WO 2016/165829 | 10/2016 |

OTHER PUBLICATIONS

Office Action issued in Chinese Patent Application No. 201880062075.9 dated Apr. 30, 2021.

* cited by examiner

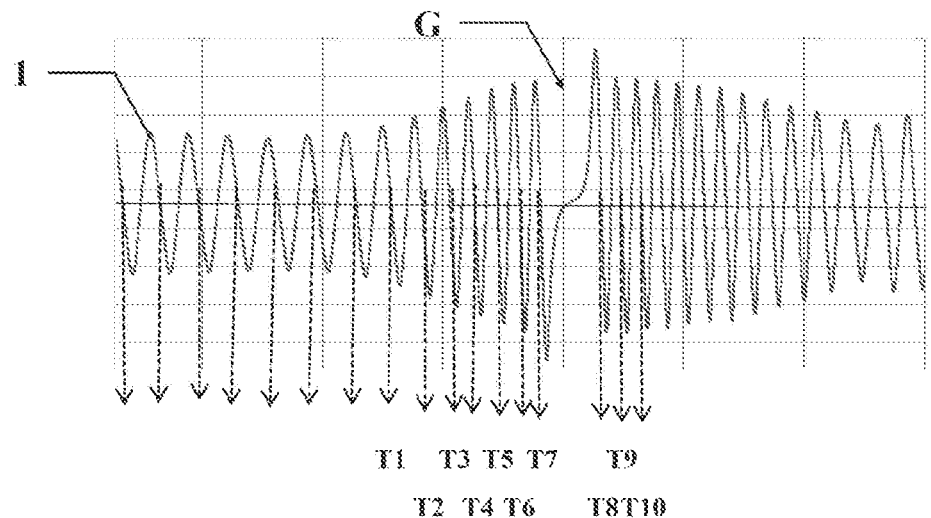
FIG. 1
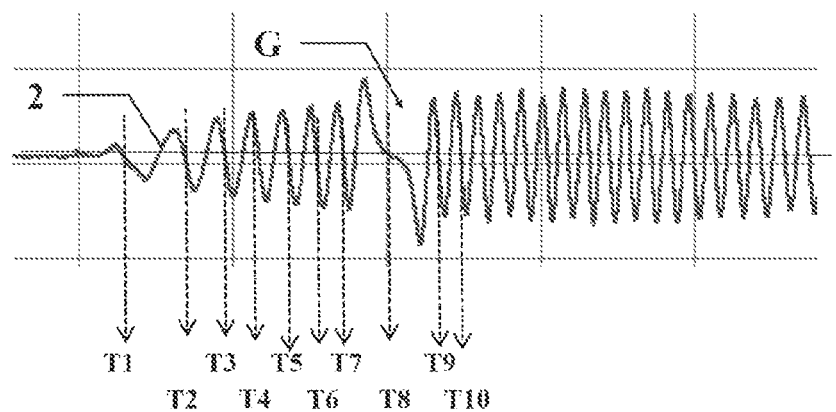
FIG. 2
FIG. 3

METHOD AND DEVICE FOR DETECTING AN INVERTED CONNECTION OF A CRANKSHAFT SENSOR

BACKGROUND OF THE INVENTION

Field of the Invention

The present invention relates generally to the field of measuring sensors. In particular, it relates to a method and a device for detecting an inverted connection for a magnetic sensor, of the type used to measure the angular position of a crankshaft, for example an engine crankshaft found in a vehicle.

Description of the Related Art

It is known, in order to establish with accuracy the angular position of an engine, like an internal combustion engine of the type used, for example, on a motor vehicle, to use a "crankshaft sensor", hereinafter referred to as crankshaft sensor. Such a sensor comprises, firstly, a toothed wheel rigidly connected to the crankshaft, including teeth that are regularly spaced at the periphery thereof and a turn marker, and secondly a magnetic sensing element, rigidly connected to the frame, that can detect the presence and/or the absence of matter, and placed in proximity to the periphery of said toothed wheel, in order to detect the presence and/or the absence of a tooth and/or of the turn marker, when said toothed wheel moves in front of the sensing element.

Such a sensing element measures, and provides, across two terminals/wires, a potential difference indicative of an electrical field forming in the sensing element, and which potential difference is modified by the presence and/or the absence of a tooth in proximity.

Such a crankshaft sensor is used to determine the angular position of the crankshaft and therefore of the engine. This information is used by engine control, for example for introducing fuel at the correct orientation, during the engine cycle.

During the mounting or replacement of such a sensor, a connection error can occur, consisting of an inversion of the two wires, at any point of the harness linking the sensor to a computer. The consequence of this is to invert the observed signal. This means that the detection of a tooth and above all of the turn marker is angularly offset in a detrimental manner.

SUMMARY OF THE INVENTION

Therefore, a means of diagnosing such an inverted connection scenario is sought.

This objective is achieved thanks to a method for diagnosing an inverted connection of a crankshaft sensor, said crankshaft sensor comprising, firstly, a toothed wheel rigidly connected to the crankshaft, including teeth that are regularly spaced at the periphery thereof and a turn marker, and, secondly, a magnetic sensing element, rigidly connected to a frame, that can detect the presence and/or the absence of matter, and placed in proximity to the periphery of said toothed wheel, in order to detect the presence and/or the absence of a tooth and/or of the turn marker, when said toothed wheel moves in front of the sensing element, the method comprising the following steps:

acquiring a signal by means of the crankshaft sensor, when the crankshaft rotates in a known direction during engine start-up, at each detection of a tooth, determining a tooth time elapsed since the previous tooth detection, at each detection of a tooth, calculating a ratio of the tooth times according to the formula $Ri=(Ti-1)^2/(Ti*Ti-2)$, where $Ri$ is the ratio, $Ti$ is the last tooth time, $Ti-1$ is the penultimate tooth time, and $Ti-2$ is the tooth time preceding the penultimate tooth time, comparing the ratio with a low threshold, indicative of a turn marker, and a high threshold, indicative of an absence of an inverted connection, a ratio between the two thresholds being indicative of an inverted connection.

Thus, this solution makes it possible to achieve the aforementioned objective. In particular, this is thanks to the clever and differentiating use of the two high and low thresholds, which are judiciously determined.

According to another feature, the low threshold is between 1 and a first value, equal to the maximum of the ratio obtained using a sensor with an inverted connection, and the high threshold is between the first value and a second value, equal to the maximum of the ratio obtained with a correctly connected sensor.

According to another feature, a ratio greater than the high threshold is indicative of an absence of inversion.

According to another feature, the condition of a ratio between the two thresholds is only indicative of an inverted connection of the crankshaft sensor after a number of repetitions, preferentially equal to 6.

According to another feature, the condition of a ratio greater than the high threshold is only indicative of an absence of inverted connection of the crankshaft sensor after a number of repetitions, preferentially equal to 10.

According to another feature, a tooth detection corresponds to a downward, or upward respectively, zero crossing of the signal.

The invention further relates to a device for diagnosing an inverted connection of a crankshaft sensor comprising at least one computer, a crankshaft sensor comprising, firstly, a toothed wheel rigidly connected to the crankshaft, including teeth that are regularly spaced at the periphery thereof and a turn marker, and, secondly, a magnetic sensing element, rigidly connected to a frame, that can detect the presence and/or the absence of matter, and placed in proximity to the periphery of said toothed wheel, in order to detect the presence and/or the absence of a tooth and/or of the turn marker, when said toothed wheel moves in front of the sensing element, characterized in that it is configured to implement the method according to the invention.

BRIEF DESCRIPTION OF THE DRAWINGS

Other novel features and advantages of the invention will emerge on reading the description below, which is provided by way of indication and entirely without limitation, with reference to the appended drawings, in which:

FIG. 1 illustrates a signal measured by a correctly connected crankshaft sensor, FIG. 2 illustrates a signal measured by a crankshaft sensor connected with an inversion, FIG. 3 shows a table of values for tooth times and ratios obtained for a correctly connected sensor and for an inverted sensor, respectively.

DESCRIPTION OF THE PREFERRED EMBODIMENTS

Figure 4:
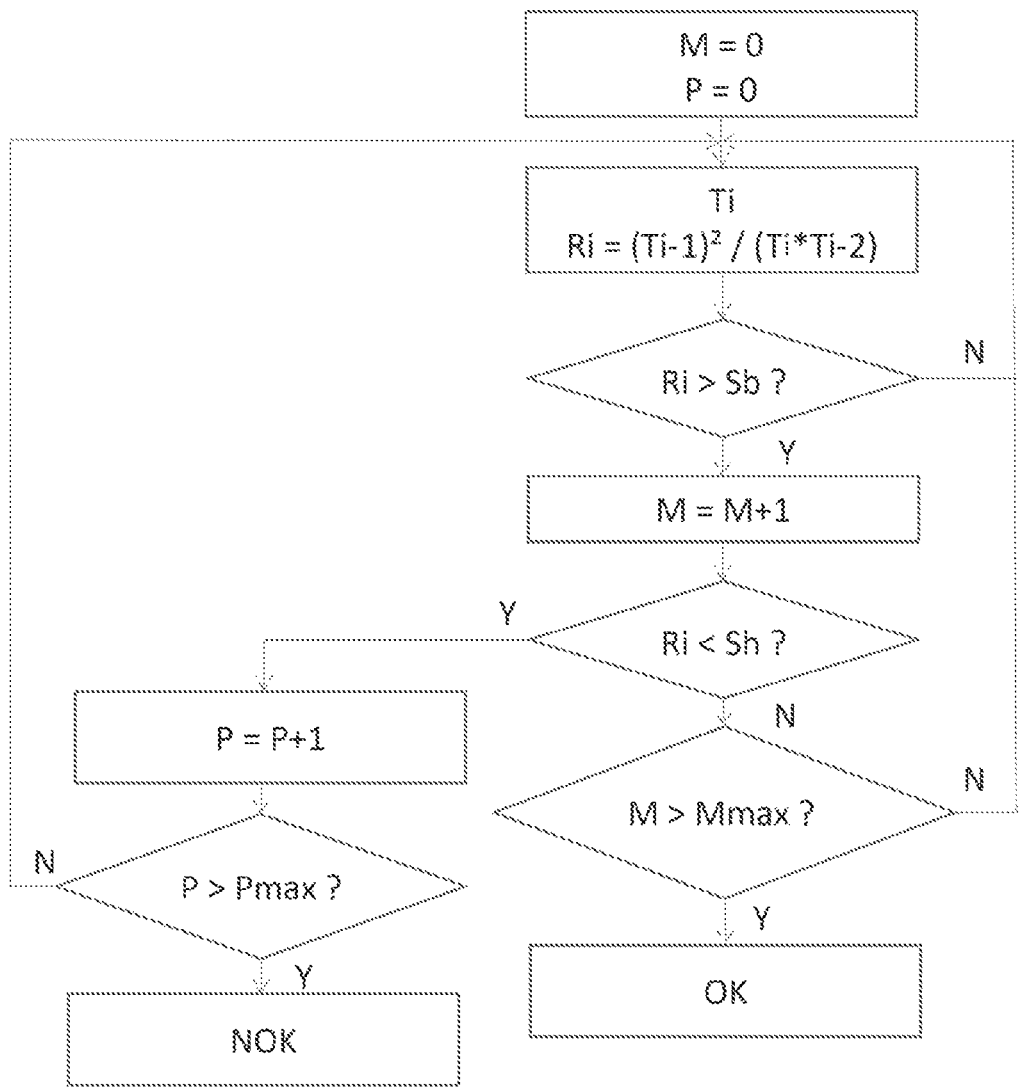
FIG. 4 shows a block diagram of a possible embodiment of the inversion detecting method.

To improve clarity, identical or similar elements are denoted by identical reference signs throughout the figures.

The invention relates to a method for diagnosing an inversion of a crankshaft sensor.

A sensor comprises, firstly, a toothed wheel rigidly connected to the crankshaft, produced from ferromagnetic material, including teeth that are regularly spaced at the periphery thereof and a turn marker, and, secondly, a magnetic sensing element, rigidly connected to the frame, that can detect the presence and/or the absence of matter, and placed in proximity to the periphery of said toothed wheel, in order to detect the presence and/or the absence of a tooth and/or of the turn marker, when said toothed wheel moves in front of the sensing element.

The turn marker is obtained by an intentional "anomaly", such as an absence of at least one tooth. A conventional, but non-essential, embodiment comprises 60 teeth that are evenly distributed angularly according to a constant diametral pitch, a turn marker consisting in 2 missing teeth and leaving 58 remaining teeth.

The sensing element typically used is a passive magnet sensing element, of a type also called VR (variable reluctance). Such a sensing element measures, and provides, across two terminals/wires, a potential difference indicative of an electrical field forming in the sensing element, and which potential difference is modified by the presence and/or the absence of a tooth in proximity.

Such a crankshaft sensor is used to precisely determine, with a precision of approximately one tooth, the angular position of the crankshaft and therefore of the engine. This information is used by engine control, for example for introducing fuel at the correct orientation, during the engine cycle.

During the mounting or replacement of such a sensor, it is possible for a connection error to occur, consisting of an inversion of the two wires at any point of the harness linking the sensor to a computer. The consequence of this is to invert the observed signal.

Thus, FIG. 1 illustrates a signal 1 obtained using a correctly connected sensor, whereas FIG. 2 illustrates a, substantially opposite, signal 2 obtained using an inverted sensor.

These show an alternating signal 1, 2 having a maximum opposite an absent tooth and a minimum opposite a present tooth. A "disruption" to the signal appears when the turn marker G or "gap" passes by, due to the absence of two teeth.

The detection of a tooth is conventionally performed, using the signal 1, 2, by means of an easily identifiable and above all easily detectable event. The presence of a tooth opposite the sensing element of the sensor is expressed, on the signal 1, 2, by a minimum. Such a minimum constitutes an identifiable event and could be the detected event. Alternatively, the maximum could also be used. However, a zero crossing of the signal 1, 2 can be more easily detected. The error made on the crankshaft angle, between an extremum and an immediately preceding (or following) zero crossing, can be either neglected or corrected, for example by interpolation. Thus, in the remainder of the present description, it is considered that a tooth detecting event is produced during a zero crossing of the signal 1, 2. Furthermore, it is recommended to consider only one zero crossing out of two: either an upward zero crossing, or a downward zero crossing. Both conventions are possible. Depending on the type of sensor used, one of the two conventions is advantageous in that it exhibits no inflection, which is the cause of a detrimental measuring imprecision. It is considered in the remainder of the present description, if precision is necessary, that a tooth detecting event is produced during a downward zero crossing.

As a result of the selected zero crossing convention, the turn marker G is detected at the end of the oscillation for a correctly connected sensor and in the middle of the oscillation, at the inflection point, for an inverted sensor. The opposite would occur for an inverted convention: upward zero crossing. Thus, the detected position of the turn marker is angularly offset in a detrimental manner, in the case of inversion of the sensor.

The method for diagnosing an inversion of a crankshaft sensor according to the invention comprises the following steps: acquiring a signal 1, 2 by means of the crankshaft sensor, at each detection of a tooth, determining a tooth time $T_i$, a tooth time being a time elapsed between a previous tooth detection and a following tooth detection, at each detection of a tooth, calculating a ratio $R_i$ of the tooth times according to the formula $R_i=(T_{i-1})^2/(T_i*T_{i-2})$, where $R_i$ is the ratio, $T_i$ is the last tooth time, $T_{i-1}$ is the penultimate tooth time, and $T_{i-2}$ is the tooth time preceding the penultimate tooth time, comparing the ratio $R_i$ with a low threshold $S_b$, indicative of a turn marker, and a high threshold $S_h$, indicative of an absence of inversion, a ratio $R_i$ between the two thresholds $S_b$, $S_h$ being indicative of an inversion.

The various steps will now be discussed in detail. The acquisition of the signal makes it possible to obtain a signal with the form of the signal 1 of FIG. 1 or of the signal 2 of FIG. 2. For each tooth detection, i.e. as detailed above for each downward zero crossing, the tooth detection/zero crossing event is dated. This makes it possible, through the difference in the dates, at each new tooth detection, to determine a tooth time $T_i$ corresponding to the duration elapsed since the preceding tooth detection. FIGS. 1 and 2 show the variations in the signal 1, 2 corresponding to the seven tooth detections preceding a turn marker G and the seven corresponding tooth times T1-T7 and to the three tooth detections during or following the turn marker G and the three corresponding tooth times T8-T10.

For each tooth detection, i.e. as detailed above for each downward zero crossing, a ratio $R_i$ of the tooth times according to the formula $R_i=(T_{i-1})^2/(T_i*T_{i-2})$ is again calculated. Thus, for example, during the detection of the fourth tooth, a tooth time T4 is determined. The corresponding ratio R4 is then equal to $(T3*T3)/(T4*T2)$.

The tooth times $T_i$ vary with the rotation speed of the crankshaft, becoming shorter as said speed increases. Calculating the ratio $R_i$ makes it possible to overcome this variation by comparing successive tooth times in order to highlight a variation.

Thus, when the sensing element is opposite regular teeth (away from the turn marker), the successive tooth times are substantially equal to: $T_i \approx T_{i-1} \approx T_{i-2}$. As a result, the ratio $R_i$ is substantially equal to 1.

By contrast, when the sensing element is opposite the turn marker G, the ratio $R_i$ moves greatly away from 1 upward and downward. Advantageously, the behaviour of the ratio $R_i$ is different for a correctly connected sensor and for an inverted sensor. This characteristic difference is utilized by the invention.

The table of FIG. 3 gives a comparison of the normalized tooth times $T_i$ (divided by a same mean value) and the corresponding ratios $R_i$, in proximity to a turn marker/gap G, firstly for a correctly connected sensor (top lines) and secondly for an inverted sensor (bottom lines).

It can be observed, for a normal sensor, when the toothed wheel rotates at a substantially constant speed, that the ratio $R_i$ drops to a value of ⅓, then rises again to an extremely high first value of 9. By contrast for an inverted sensor, the ratio $R_i$ drops to a value of ½, then rises again to a clearly less high value of 2. This different behaviour is repeatable and can thus be utilized to differentiate the two cases.

It appears in both cases that the ratio Ri moves away from 1 when the turn marker G passes by. This is utilized to detect a turn marker G, when the ratio Ri becomes less than a threshold less than 1 and/or when the ratio Ri becomes greater than a threshold greater than 1.

The invention uses the fact that the ratio Ri becomes greater than 1 at the passing of the turn marker with a first value, 2 in the example, in the presence of an inversion, and a second value, 9 in the example, greater than the first value, in the absence of inversion.

The first value is the maximum of the ratio Ri obtained with an inverted sensor, over the entire measurement range, i.e. over one crankshaft wheel turn. In a similar manner, the second value is the maximum of the ratio Ri obtained with a correctly connected sensor, over the entire measurement range.

Thus, to differentiate the two cases, normal sensor and inverted sensor, a first low threshold Sb, indicative of a turn marker G, is used. As seen above, a low threshold Sb, indicative of a turn marker, means that it is greater than 1. A second high threshold Sh, indicative of an absence of inversion, is further used. As seen above, the high threshold Sh indicating an absence of inversion means that this makes it possible to produce the differentiation, and therefore that the high threshold Sh is less than the second value, the maximum high value taken by the ratio Ri in the normal case, namely 9 in the example, and is greater than the first value, the maximum high value taken by the ratio Ri in the inverted case, namely 2 in the example. The low threshold Sb must be less than the first value. It can be noted that the high threshold Sh is greater than the low threshold Sb.

The low threshold Sb is between 1 and the first value. The high threshold Sh is between the first value and the second value.

A person skilled in the art understands from the above that the method can be used for any type of crankshaft wheel, irrespective of the total number of teeth thereof, the number of turn markers, and the number of teeth missing from each such turn marker. The latter knows, in view of the teachings given in the preceding paragraphs, how to determine the two appropriate low Sb and high Sh thresholds, as a function of the first value and of the second value of the ratios, which values are measured for an inverted sensor and for a normal sensor, respectively.

The wheel used for example, notably for the table of FIG. 3, is a wheel with 60 evenly distributed teeth, comprising a turn marker G consisting of an absence of 2 teeth. Such a wheel is typically designated as 60–1×2 or 60–2, where 60 is the initial total number of teeth, before removal of a tooth/teeth in order to form the turn marker, 1 is the number of turn markers, and 2 is the number of missing teeth forming the turn marker.

For such a 60-2 wheel, the first value is 2 and the second value is 9. Thus, the low threshold Sb is between 1 upward-bound and 2 downward-bound, and the high threshold is between 2 upward-bound and 9 upward-bound. To take into account a possible variation of the ratio Ri, and limit the diagnostic errors, a certain margin, for example 0.2 is advantageously respected: the low threshold Sb is then advantageously between 1.2 and 1.8 and the high threshold Sb is advantageously between 2.2 and 8.8. According to a preferred embodiment, the selected values are a low threshold Sb equal to 1.5 and a high threshold Sh equal to 4.5.

A comparison of the ratio Ri with the low threshold Sb thus makes it possible to detect a turn marker. A comparison of the ratio Ri with the high threshold Sh makes it possible to differentiate an inverted sensor: when the ratio Ri is between the two thresholds Sb, Sh, from a normal sensor: when the ratio Ri is greater than the high threshold Sh.

According to an embodiment, the diagnosis is performed once one of the two conditions, Ri between Sb and Sh or Ri greater than Sh, is achieved.

According to another embodiment, however, to provide reassurance on the diagnosis, the decision is not taken upon the first occurrence of one of the two conditions. Thus, the condition of a ratio Ri between the two thresholds Sb, Sh only becomes indicative of an inversion after a number P max of repetitions of said condition. The number P max can be any number. However, the method, through the use of the ratio Ri as defined, is extremely robust. A low value, for example P max=6, is satisfactory.

Likewise, the condition of a ratio Ri greater than the high threshold Sh only becomes indicative of an absence of inversion after a number M max of repetitions of said condition. The number M max can be any number. However, in view of the robustness of the method, a low value, for example M max=10, is satisfactory.

As shown in FIG. 4, the block diagram shows a possible embodiment of the method. At the start, counters M and P are reset. At each tooth detection, a tooth time Ti and a ratio Ri are calculated. The ratio Ri is compared with the low threshold Sb. While it remains below the low threshold Sb (the ratio Ri being substantially equal to 1), the sensing element is not opposite a turn marker. If it becomes greater than the low threshold Sb, a turn marker G is detected. The counter M (for turn marker) is incremented. The ratio Ri is then compared with the high threshold Sh. If Ri is greater than the high threshold Sh, the counter M is compared with a number M max. If this value is reached or exceeded, the conclusion reached is of a normal connection of the sensor (not inverted). If the ratio Ri is less than the high threshold Sh, the counter P (for inversion) is incremented and compared with a number P max. If this value is reached or exceeded, the conclusion reached is of an inversion of the sensor.

To ensure that the result of the diagnosis is pertinent, it should preferably be applied when the crankshaft rotates in a known direction. As regards the crankshaft of an internal combustion engine, it is extremely rare that it rotates in the wrong direction, but this can occur. The method according to the invention can evidently be used for both rotation directions. Nevertheless, it is recommended that this direction is known in order to produce a correct diagnosis. In order to produce this known rotation direction condition, the method is advantageously used during a stage where the rotation direction is known with certainty: when the engine is driven by the starter, namely during starting. Moreover, since the intervention that has caused the inversion can only take place with the engine stopped, it is advantageous to detect it as early as possible, once the engine runs again during the first restart.

It can be inferred from the above that the invention can advantageously be used to detect an inversion of the rotation direction of the crankshaft/engine.

The invention further relates to a device for diagnosing an inversion of a crankshaft sensor comprising at least one computer, for example an engine computer on board a vehicle, a crankshaft sensor, for example as described above also on board the vehicle, the device being configured by software in order to implement the method as described above for example.

The invention can be used, by means of factory equipment, at the end of a production line to check that a crankshaft sensor is correctly connected.

Alternatively and preferably, the invention can be integrated into one of the computers on board a vehicle in order to perform the diagnosis in a recurring manner and thus be able to diagnose an inversion of a crankshaft sensor when first mounted or during the lifetime, following a maintenance operation, like a replacement of the crankshaft sensor.

The invention is described above by way of example. It is understood that a person skilled in the art is able to produce different variant embodiments of the invention, for example by combining the various features above taken alone or in combination, without departing from the scope of the invention in doing so.

The invention claimed is:

1. A method for diagnosing an inverted connection of a crankshaft sensor including a toothed wheel rigidly connected to the crankshaft and a magnetic sensing element rigidly connected to a frame, the toothed wheel including teeth regularly spaced at a periphery thereof and a turn marker, the magnetic sensing element configured to detect a presence and/or an absence of matter, the magnetic sensing element disposed in proximity to the periphery of said toothed wheel in order to detect one or more of a presence and an absence of one or more of (i) a tooth of the teeth and (ii) the turn marker, when said toothed wheel moves in front of the magnetic sensing element, the method comprising:
acquiring a signal by the crankshaft sensor, when the crankshaft rotates in a direction during engine start-up,
at each detection of one tooth of the teeth,
determining a tooth time $T_i$ elapsed since a previous tooth detection, and
calculating a ratio $R_i$ of the tooth times according to the formula $R_i = (T_{i-1})^2 / (T_i \cdot T_{i-2})$, where $R_i$ is the ratio, $T_i$ is the last tooth time, $T_{i-1}$ is the penultimate tooth time, and $T_{i-2}$ is the tooth time preceding the penultimate tooth time; and
comparing the ratio $R_i$ with a low threshold indicative of the turn marker, and a high threshold indicative of an absence of an inverted connection,
wherein the ratio $R_i$ being between the two thresholds is indicative of the inverted connection.

2. The method as claimed in claim 1, wherein the low threshold is between 1 and a first value, the low threshold being equal to the maximum of the ratio $R_i$ obtained using a sensor with an inverted connection, and the high threshold is between the first value and a second value, the high threshold being equal to the maximum of the ratio $R_i$ obtained with a correctly-connected sensor.

3. The method as claimed in claim 1, wherein the ratio $R_i$ being greater than the high threshold is indicative of an absence of inversion.

4. The method as claimed in claim 1, wherein the ratio $R_i$ being between the low and high thresholds is only indicative of the inverted connection of the crankshaft sensor after a number P max of repetitions.

5. The method as claimed in claim 1, wherein the ratio $R_i$ being greater than the high threshold is only indicative of an absence of the inverted connection of the crankshaft sensor after a number M max of repetitions.

6. The method as claimed in claim 1, wherein a tooth detection corresponds to a downward zero crossing of the signal.

7. The method as claimed in claim 1, wherein a tooth detection corresponds to an upward zero crossing of the signal.

8. The method as claimed in claim 2, wherein the ratio $R_i$ being greater than the high threshold is indicative of an absence of inversion.

9. The method as claimed in claim 2, wherein the ratio $R_i$ being between the low and high thresholds is only indicative of the inverted connection of the crankshaft sensor after a number P max of repetitions.

10. The method as claimed in claim 3, wherein the ratio $R_i$ being between the low and high thresholds is only indicative of the inverted connection of the crankshaft sensor after a number P max of repetitions.

11. The method as claimed in claim 2, wherein the ratio $R_i$ being greater than the high threshold is only indicative of an absence of the inverted connection of the crankshaft sensor after a number M max of repetitions.

12. The method as claimed in claim 3, wherein the ratio $R_i$ being greater than the high threshold is only indicative of an absence of the inverted connection of the crankshaft sensor after a number M max of repetitions.

13. The method as claimed in claim 4, wherein the ratio $R_i$ being greater than the high threshold is only indicative of an absence of the inverted connection of the crankshaft sensor after a number M max of repetitions.

14. The method as claimed in claim 2, wherein a tooth detection corresponds to a downward zero crossing of the signal.

15. The method as claimed in claim 3, wherein a tooth detection corresponds to a downward zero crossing of the signal.

16. The method as claimed in claim 2, wherein a tooth detection corresponds to an upward zero crossing of the signal.

17. The method as claimed in claim 3, wherein a tooth detection corresponds to an upward zero crossing of the signal.

18. The method as claimed in claim 1, wherein the ratio $R_i$ being between the low and high thresholds is only indicative of the inverted connection of the crankshaft sensor after a number P max of repetitions equal to 6.

19. The method as claimed in claim 1, wherein the ratio $R_i$ being greater than the high threshold is only indicative of an absence of the inverted connection of the crankshaft sensor after a number M max of repetitions equal to 10.

20. A device being configured to diagnose the inverted connection of a crankshaft sensor, the device comprising:
at least one computer; and
a crankshaft sensor comprising
a toothed wheel rigidly connected to the crankshaft, the toothed wheel including teeth regularly spaced at the periphery thereof and a turn marker, and
a magnetic sensing element rigidly connected to a frame, the magnetic sensing element configured to detect a presence and/or an absence of matter, the magnetic sensing element in proximity to the periphery of said toothed wheel, in order to detect the presence and/or the absence of a tooth and/or of the turn marker, when said toothed wheel moves in front of the sensing element,
wherein the crankshaft sensor is configured to acquire a signal, when the crankshaft rotates in a direction during engine start-up, and
wherein the computer is configured, at each detection of one tooth of the teeth, to
determine a tooth time $T_i$ elapsed since a previous tooth detection, and
calculate a ratio $R_i$ of the tooth times according to the formula $R_i = (T_{i-1})^2 / (T_i \cdot T_{i-2})$, where $R_i$ is the ratio, Ti is the last tooth time, Ti−1 is the penultimate tooth time, and Ti−2 is the tooth time preceding the penultimate tooth time,
wherein the computer is configured to compare the ratio Ri with a low threshold indicative of the turn marker, and a high threshold indicative of an absence of an inverted connection, and
wherein the ratio Ri being between the two thresholds is indicative of the inverted connection.

* * * * *